(12) United States Patent
Chau et al.

(10) Patent No.: US 6,806,513 B2
(45) Date of Patent: Oct. 19, 2004

(54) HETEROJUNCTION BIPOLAR TRANSISTOR HAVING WIDE BANDGAP MATERIAL IN COLLECTOR

(75) Inventors: Hin Fai Chau, Fremont, CA (US); Clarence John Dunnrowicz, Santa Cruz, CA (US); Yan Chen, Fremont, CA (US); Chien Ping Lee, Fremont, CA (US)

(73) Assignee: EIC Corporation, Fremont, CA (US)

( * ) Notice: Subject to any disclaimer, the term of this patent is extended or adjusted under 35 U.S.C. 154(b) by 8 days.

(21) Appl. No.: 10/267,342

(22) Filed: Oct. 8, 2002

(65) Prior Publication Data

US 2004/0065898 A1 Apr. 8, 2004

(51) Int. Cl.[7] ............................................. H01L 29/737
(52) U.S. Cl. ...................................... 257/198; 257/197
(58) Field of Search .................................. 257/197, 198

(56) References Cited

U.S. PATENT DOCUMENTS 5,631,477 A * 5/1997 Streit et al. ................. 257/197
6,399,969 B1 * 6/2002 Twynam ..................... 257/191

OTHER PUBLICATIONS

William Liu, *Handbook of III–V Heterojunction Bipolar Transistors*, A Wiley–Interscience Publication, New York, pp. 68–69, 1998.

Kurishima et al., "InP/InGaAs Double–Heterojunction Bipolar Transistor with Step–Graded InGaAsP Collector," Electronics Letters, vol. 29, No. 3, Feb. 4, 1993, pp. 258–260.

Pelouard et al., Double–Heterojunction GAlInAs/GaInAs Bipolar Transistor Grown by Molecular Beam Epitaxy, IEEE Eletcron Device Letters, vol. EDL–7, No. 9, Sep. 1986, pp. 516–518.

* cited by examiner

Primary Examiner—Jerome Jackson
(74) Attorney, Agent, or Firm—Beyer Weaver & Thomas LLP

(57) ABSTRACT

The safe operating area (SOA) in a heterojunction bipolar transistor is improved by inserting a material between the collector and subcollector of the transistor with the insertion layer being a material having a wider energy bandgap than the material of the collector. The insertion layer increases the breakdown field at the collector-subcollector junction and thereby increases the Kirk effect induced breakdown voltage.

27 Claims, 2 Drawing Sheets

HETEROJUNCTION BIPOLAR TRANSISTOR HAVING WIDE BANDGAP MATERIAL IN COLLECTOR

BACKGROUND OF THE INVENTION

This invention relates generally to heterojunction bipolar transistors (HBT), and more particularly the invention relates to improving the safe-operating area (SOA) of such a transistor.

Heterojunction bipolar transistors (e.g. III–V compound semiconductor) are used in amplifier circuits for telecommunications applications. A major concern lies in operating the transistors in safe-operating areas (SOA) to prevent overdrive and failure of the devices. As shown in FIG. 1, the SOA is defined by two boundaries. The first boundary, SOA Boundary I, is limited by the open-emitter base-collector junction breakdown voltage, BVcbo, of the transistor. This boundary sets the operating limit of the transistor at low current densities. The second boundary, SOA Boundary II, is related to the collector breakdown when substantial injected current carriers are present in the collector. This boundary is important at medium to high current levels. If one attempts to operate a HBT beyond the SOA boundaries in the non-safe operating areas as shown in the figure, the device will catastrophically fail. The conventional way to increase the collector breakdown voltage is to increase the thickness and to decrease the doping concentration of the collector. Using the approach, conventional HBT's have been produced with a BVcbo of around 70 volts by using a collector with a thickness of 3 μm and a dopant concentration of 6e15 ions $cm^{-3}$. However, although a larger BVcbo moves SOA Boundary I to a higher Vce, the SOA Boundary II does not necessarily move to a higher collector current, Ic. In fact, breakdown always happens at a voltage smaller than BVcbo when there is large current flowing through the transistor. This is a result of the Kirk effect.

The Kirk effect results when the collector increases to a high enough level and the number of injected electrons compensates the space charge in the collector and changes the electric field distribution. The effect happens when the effective injected charge density exceeds the background doping concentration in the collector, and the space charge changes sign and the location of the high field region moves from the base-collector junction to the collector-subcollector junction. The breakdown then is no longer controlled by the doping density in the collector alone, but also by the collector current. As Ic increases, the effective negative space charge density increases, and this causes the electric field to increase at the collector-subcollector junction, and results in a reduction of breakdown voltage. Further, decreasing of the collector doping will only improve the low current breakdown voltage but will not improve the medium and high current breakdown voltage.

BRIEF SUMMARY OF THE INVENTION

The standard heterojunction bipolar transistor has a uniformly doped collector which is normal for providing a high breakdown voltage. In accordance with the invention, a layer of wider bandgap (e.g., the separation between the energy of the lowest conduction band and that of the highest valence band) material is inserted at the collector-subcollector junction. The inserted material has a larger breakdown field than the collector material, and since the Kirk effect induced breakdown occurs near the collector-subcollector junction, the breakdown voltage is increased and the SOA Boundary II is moved upward to higher Ic levels.

The wide bandgap material should be kept thin relative to the total collector layer thickness or the electron transport across the collector layer may change with the electrical and thermal properties dominated by the properties of the wide bandgap material rather than the small bandgap material in the collector.

To insure the high field region that contributes to collector breakdown and therefore the SOA Boundary II at medium to high current levels appears entirely in the wide bandgap material, the wide bandgap insertion layer can be extended into the heavily doped subcollector. In this embodiment the insertion layer includes a lightly doped part in the subcollector side of the collector structure and a more heavily doped part in the collector side of the subcollector structure.

The invention and objects and features thereof will be more readily apparent from the following detailed description and the dependent claims when taken with the drawing.

DETAILED DESCRIPTION OF THE INVENTION

Figure 2:
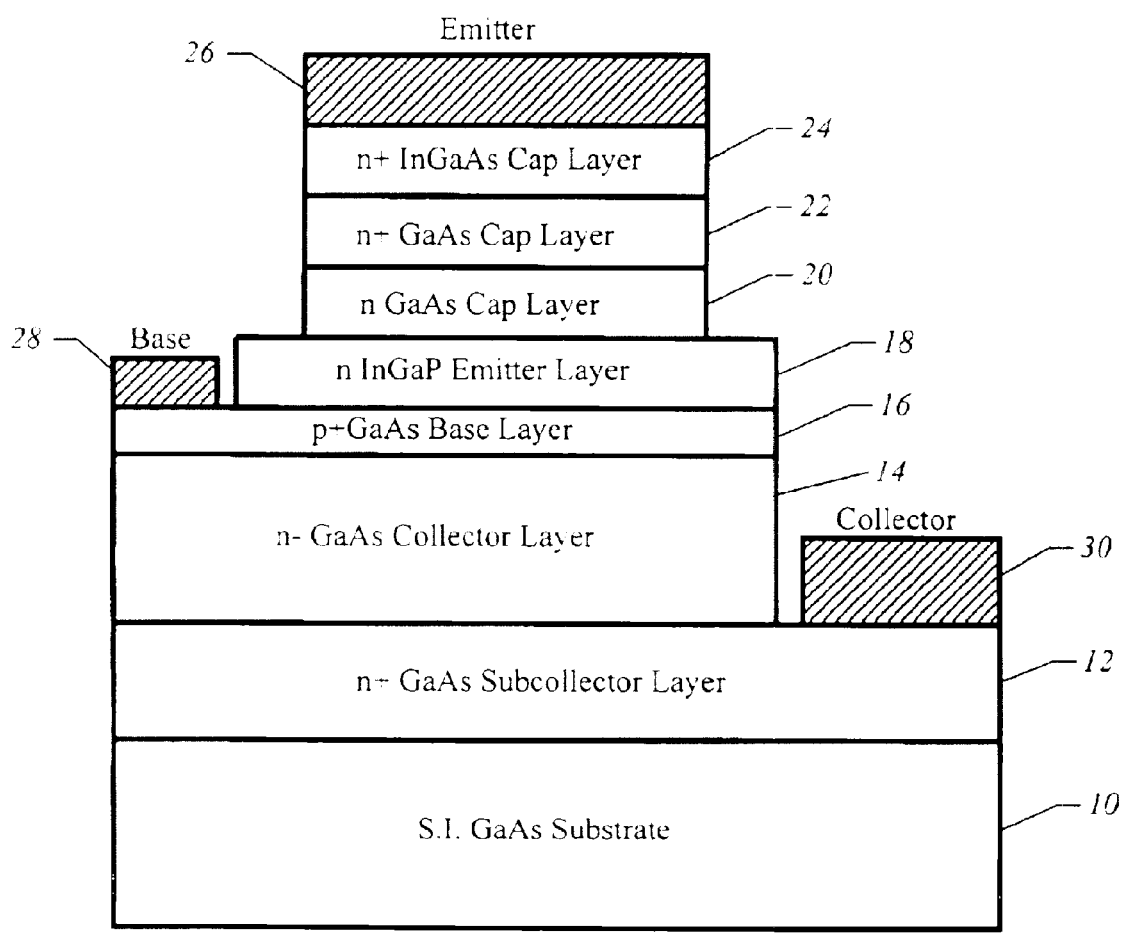
FIG. 2 is a section view of a conventional heterojunction bipolar transistor.

FIG. 2 is a section view of a conventional heterojunction bipolar transistor which includes a GaAs substrate 10 on which is formed an $N^+$ GaAs subcollector layer 12 with an $N^-$ GaAs collector layer 14 on the subcollector layer. The base layer comprises a $P^+$ GaAs layer 16 and the emitter includes an N InGaP layer 18. Formed on emitter layer 18 is an N GaAs cap layer 20 with an $N^+$ GaAs cap layer 22 and an $N^+$ InGaAs cap layer 24 overlying emitter layer 18. Contacts 26, 28, and 30 are provided to the emitter, base, and collector, respectively.

Figure 1:
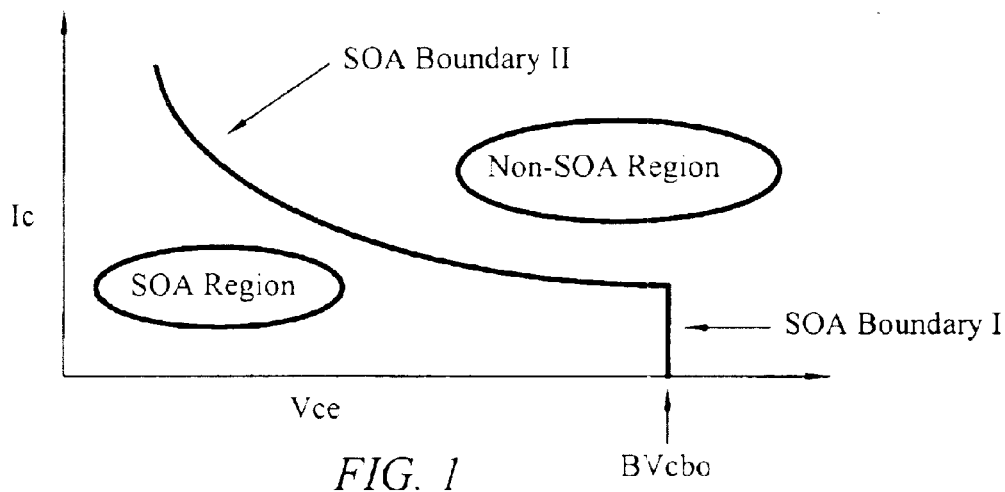
FIG. 1 is a graph of collector current, Ic, versus collector-emitter voltage, Vce, showing the safe operating area (SOA).
Figure 3:
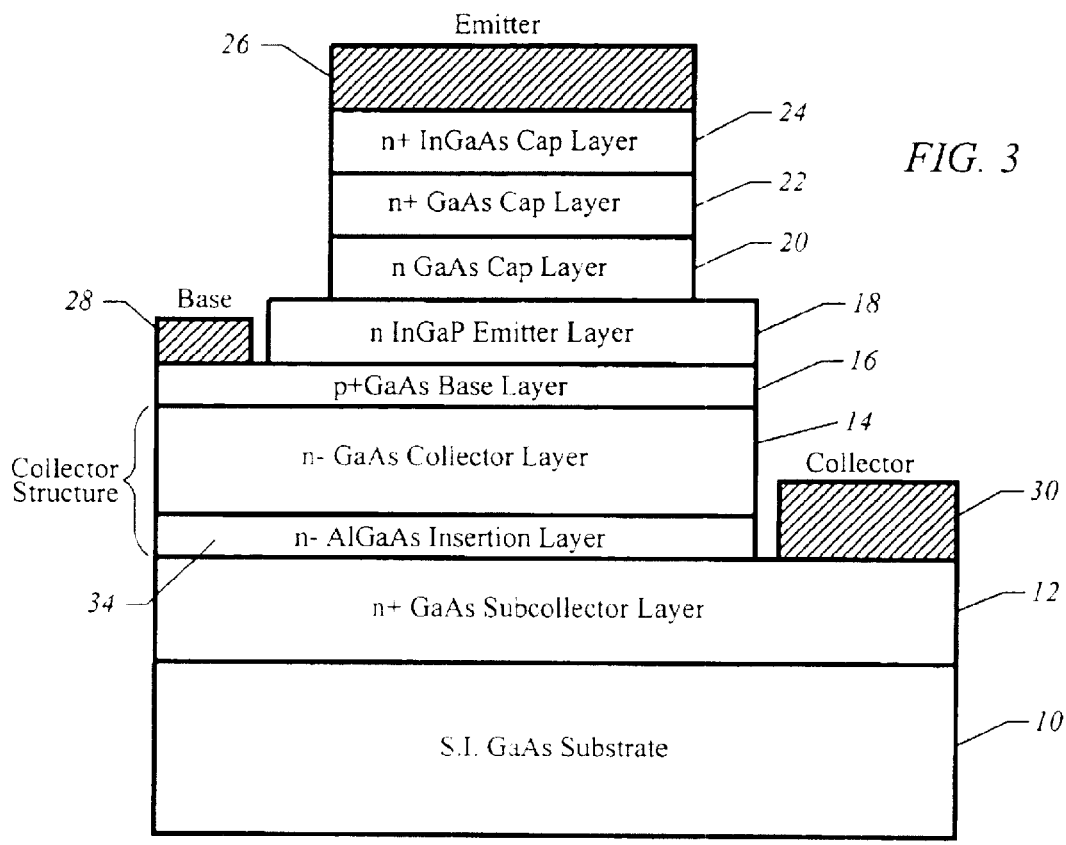
FIG. 3 is a section view of a heterojunction bipolar transistor in accordance with one embodiment of the invention.

Since the Kirk effect induced breakdown occurs near the collector-subcollector junction, in accordance with the invention a layer of wider bandgap material is inserted at the collector-subcollector junction to thereby increase the breakdown voltage and move the SOA Boundary II upward as shown in FIG. 1 to higher currents. Using the same reference numerals for common elements in FIGS. 2 and 3, FIG. 3 illustrates one embodiment of the invention in which an $N^-$ doped AlGaAs wide bandgap (relative to GaAs) layer 34 is inserted in the collector structure and abuts $N^+$ GaAs subcollector layer 12. The dopant concentrations can be on the order of 7e15 ions $cm^{-3}$ for the collector and insertion layer and 4e18 ions $cm^{-3}$ for the subcollector. The wide bandgap insertion layer should be kept thin relative to the total collector layer thickness or else the electron transport across the collector layer may change with the electrical and thermal properties dominated by the properties of the wide bandgap material rather than those of the small bandgap material in the collector. In one embodiment collector layer 14 is 2.5 μm in thickness and the insertion layer 34 is 0.5 μm in thickness.

In the embodiment of FIG. 3, the wide bandgap AlGaAs layer 34 is located entirely in the collector structure, as noted. However, to ensure the high field region that contributes to collector breakdown and therefor SOA Boundary II at medium to high current levels appears entirely in the wide bandgap material, the wide bandgap insertion layer can be extended into the heavily doped subcollector layer, as illustrated in the section view of FIG. 4. The insertion layer now includes two layers 36, 38 with the N⁻ doped layer 36 abutting collector layer 14 in forming a part of the collector structure, while an N⁺ insertion layer 38 abuts the subcollector layer and forms part of the subcollector structure. Again, the transistor is an InGaP/GaAs HBT with AlGaAs insertion layers, for example.

Figure 4:
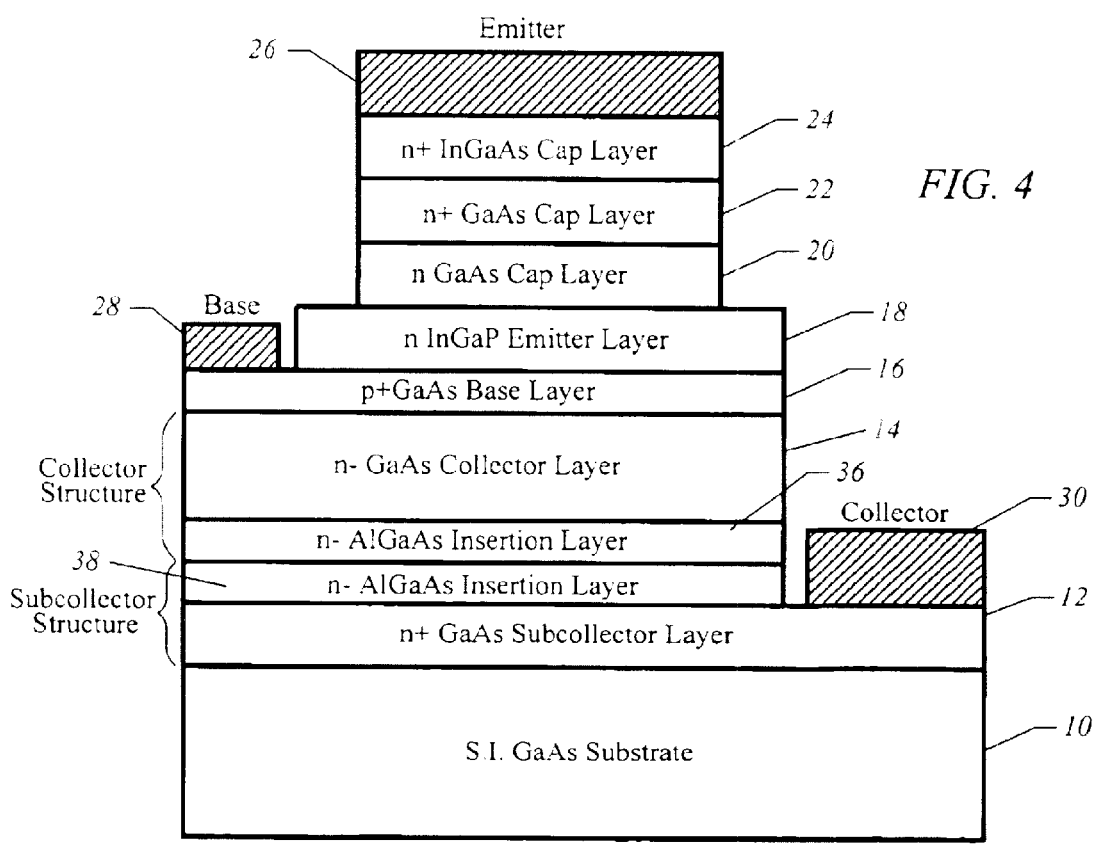
FIG. 4 is a section view of a heterojunction bipolar transistor in accordance with another embodiment of the invention.

In addition to the discrete layers in the structures of FIGS. 3 and 4, step or continuous compositional grading can be applied in the transition from the small bandgap collector layer to the wide bandgap insertion layer or layers and then from the wide bandgap insertion layer or layers to the small bandgap subcollector layer. This provides for efficient electron transport across the insertion layers.

The invention can be applied to all heterojunction bipolar transistors, including but not limited to AlGaAs/GaAs, InGaP/GaAs, InP/InGaAs, InAlAs/InGaAs and InAlGaAs/InGaAs, and Si/SiGe single and double heterojunction bipolar transistors with GaAs, InGaAs, InP, AlGaAs, InGaP, InAlAs, or a combination thereof as the collector material. For a GaAs collector, the wide bandgap insertion layer can be AlGaAs or InGaP, and the grade layer can be AlGaAs of smaller bandgap energy than that in the insertion layer. For InGaAs based collector, the wide bandgap insertion layer can be InP, InAlAs, InAlGaAs, or InGaAsP, and the grade layer can be InAlGaAs or InGaAsP of smaller bandgap energy than in the insertion layer. For a Si/SiGe HBT, the wide bandgap insertion layer can be Si or SiGe of large bandgap, the grade layer can be SiGe of medium bandgap, and the collector material is SiGe of the small bandgap energy. However, it is important to use an insertion layer at the collector-subcollector junction with a breakdown field larger than that in the base side of the collector layer for the improvement of SOA Boundary II.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A heterojunction bipolar transistor (HBT) comprising
   a) an emitter region of one conductivity type,
   b) a base region of opposite conductivity type abutting the emitter region, material in the emitter region having an energy bandgap that is wider than the energy bandgap of material in the base region.
   c) a collector region of the one conductivity type abutting the base region, material in the collector region being the same as the material in the base region
   d) a subcollector region of the one conductivity type and of higher doping concentration than the collector region, and
   e) an insertion layer of the one conductivity type between and abutting the collector region and the subcollector region and having a lower doping concentration than the subcollector region, material of the insertion layer having an energy bandgap that is wider than the energy bandgap of material in the collector region and the insertion layer is thinner than the collector region.

2. The HBT as defined by claim 1 wherein the insertion layer is compositionally graded from a smaller bandgap collector region to a wider bandgap insertion layer to a smaller bandgap subcollector region.

3. The HBT as defined by claim 1 wherein the collector region is GaAs and the insertion layer is AlGaAs.

4. The HBT as defined by claim 3 wherein the insertion layer is compositionally graded from a smaller bandgap collector region to a wider bandgap insertion layer to a smaller bandgap subcollector region.

5. The HBT as defined by claim 4 wherein the collector region is GaAs and the insertion layer is InGaP.

6. The HBT as defined by claim 1 wherein the collector region is InGaAs and the insertion layer is selected from the group consisting of InP, InAlAs, InAlGaAs, and LnGaAsP.

7. The HBT as defined by claim 6 wherein the insertion layer is compositionally graded from a smaller bandgap collector region to a wider bandgap insertion layer to a smaller bandgap subcollector region.

8. The HBT as defined by claim 1 wherein the emitter/base materials are selected from the group consisting of AlGaAs/GaAs, InGaP/GaAs, InP/InGaAs, InAlAs/InGaAs, and InAlGaAs/InGaAs.

9. The HBT as defined by claim 8 wherein the insertion layer is compositionally graded from a smaller bandgap collector region to a wider bandgap insertion layer to a smaller bandgap subcollector region.

10. The HBT as defined by claim 8 wherein the collector material is selected form the group consisting of GaAs, InGaAs, InP, AlGaAs, InGaP, InAlAs, and a combination thereof.

11. The HBT as defined by claim 1 wherein the collector region comprises a smaller band gap SiGe material and the insertion layer comprises SiGe material having a larger bandgap.

12. The HBT as defined by claim 11 wherein the insertion layer is compositionally graded from a smaller bandgap collector region to a wider bandgap insertion layer to a smaller bandgap subcollector region.

13. The HBT as defined by claim 1 wherein the collector region comprises a smaller bandgap SiGe material and the insertion layer comprises Si.

14. A heterojunction bipolar transistor (HBT) comprising
   a) an emitter region of one conductivity type,
   b) a base region of opposite conductivity type abutting the emitter region, material in the emitter region having an energy bandgap that is wider than the energy bandgap of material in the base region,
   c) a collector region of the one conductivity type abutting the base region, material in the collector region being the same as the material in the base region,
   d) a subcollector region of the one conductivity type and of higher doping concentration than the collector region, and
   e) an insertion layer of the one conductivity type comprising at least first and second layers with the first layer abutting the collector region and the second layer abutting the subcollector region, the doping of the first layer being less than the doping of the second layer and the doping of the subcollector, the first layer being thinner than the collector region.

15. The HBT as defined by claim 14 wherein the first layer and the collector region comprise a collector structure, and the second layer and the subcollector region comprise a subcollector structure.

16. The HBT as defined by claim 15 wherein the first layer and the second layer of the insertion layer are compositionally graded from a smaller bandgap collector region to a wider bandgap insertion layer to a smaller bandgap subcollector region.

17. The HBT as defined by claim 14 wherein the collector region is GaAs and the insertion layer is AlGaAs.

18. The HBT as defined by claim 17 wherein the insertion layer is compositionally graded from a smaller bandgap collector region to a wider bandgap insertion layer to a smaller bandgap subcollector region.

19. The HBT as defined by claim 18 wherein the collector region is GaAs and the insertion layer is InGaP.

20. The HBT as defined by claim 14 wherein the collector region is InGaAs and the insertion layer is selected from the group consisting of InIP, InAlAs, InAlGaAs, and InGaAsP.

21. The HBT as defined by claim 20 wherein the insertion layer is compositionally graded from a smaller bandgap collector region to a wider bandgap insertion layer to a smaller bandgap subcollector region.

22. The HBT as defined by claim 14 wherein the emitter/base materials are selected from the group consisting of AlGaAs/GaAs, InGaP/GaAs, InP/InGaAs, InAlAs/InGaAs, and InAlGaAs/InGaAs.

23. The HBT as defined by claim 22 wherein the insertion layer is compositionally graded from a smaller bandgap collector region to a wider bandgap insertion layer to a smaller bandgap subcollector region.

24. The HBT as defined by claim 22 wherein the collector material is selected form the group consisting of GaAs, InGaAs, InP, AlGaAs, InGaP, InAlAs, and a combination thereof.

25. The HBT as defined by claim 14 wherein the collector region comprises a smaller band gap SiGe material and the insertion layer comprises SiGe material having a larger bandgap.

26. The HBT as defined by claim 25 wherein the insertion layer is compositionally graded from a smaller bandgap collector region to a wider bandgap insertion layer to a smaller bandgap subcollector region.

27. The HBT as defined by claim 14 wherein the collector region comprises a smaller bandgap SiGe material and the insertion layer comprises Si.

* * * * *

UNITED STATES PATENT AND TRADEMARK OFFICE
CERTIFICATE OF CORRECTION

| | | |
|---|---|---|
| PATENT NO. | : 6,806,513 B2 | Page 1 of 1 |
| APPLICATION NO. | : 10/267342 | |
| DATED | : October 19, 2004 | |
| INVENTOR(S) | : Chau et al. | |

It is certified that error appears in the above-identified patent and that said Letters Patent is hereby corrected as shown below:

DRAWINGS:

In the drawings, Fig. 4, layer 38, should read --$n^+$AlGaAs Insertion Layer--.

Signed and Sealed this

Twenty-fifth Day of July, 2006

JON W. DUDAS
*Director of the United States Patent and Trademark Office*